(12) United States Patent
Ishida

(10) Patent No.: US 7,073,931 B2
(45) Date of Patent: *Jul. 11, 2006

(54) VEHICULAR HEADLAMP AND OPTICAL UNIT

(75) Inventor: Hiroyuki Ishida, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 10/771,022

(22) Filed: Feb. 3, 2004

(65) Prior Publication Data

US 2004/0156209 A1 Aug. 12, 2004

(30) Foreign Application Priority Data

Feb. 10, 2003 (JP) ............................. 2003-032097

(51) Int. Cl.
*B60Q 1/00* (2006.01)
(52) U.S. Cl. .................. 362/539; 362/327; 362/511
(58) Field of Classification Search ................ 362/507, 362/327, 329, 511, 516, 555, 539
See application file for complete search history.

(56) References Cited

U.S. PATENT DOCUMENTS

| | | | | |
|---|---|---|---|---|
| 2,469,080 A | * | 5/1949 | Rosin et al. ................ | 362/327 |
| 4,733,335 A | | 3/1988 | Serizawa et al. | |
| 6,097,549 A | * | 8/2000 | Jenkins et al. .............. | 359/726 |
| 6,547,423 B1 | * | 4/2003 | Marshall et al. ............. | 362/333 |
| 6,724,543 B1 | * | 4/2004 | Chinniah et al. ........... | 359/718 |
| 6,811,277 B1 | * | 11/2004 | Amano ....................... | 362/602 |
| 6,819,505 B1 | * | 11/2004 | Cassarly et al. ............ | 359/726 |
| 2002/0105268 A1 | | 8/2002 | Schliep et al. | |

FOREIGN PATENT DOCUMENTS

| | | |
|---|---|---|
| EP | 0 495 685 A1 | 7/1992 |
| EP | 0 721 085 A1 | 7/1996 |
| JP | 4-39137 | 2/1992 |
| JP | 2001-266620 | 9/2001 |
| JP | 2002-50214 | 2/2002 |
| JP | 2002-94129 | 3/2002 |
| JP | 2002-184219 | 6/2002 |
| KR | 1999-0063152 | 7/1999 |

OTHER PUBLICATIONS

Patent Abstracts of Japan, Publication No. 2001-266620 dated Sep. 28, 2001, 1 pg.
Patent Abstracts of Japan, Publication No. 2002-050214 dated Feb. 15, 2002, 1 pg.

(Continued)

*Primary Examiner*—Ali Alavi
(74) *Attorney, Agent, or Firm*—Osha Liang L.L.P.

(57) ABSTRACT

A vehicular headlamp used in au automobile, includes: a light source for generating light; a light transmitting member formed from material transmitting the light; a reflector, formed on at least a part of a surface of the light transmitting member, for reflecting the light incident via the light transmitting member from the light source, the reflector having an optical center near the light source; and a lens formed integrally with the light transmitting member for deflecting the light reflected by the reflector to direct the light to the outside of the vehicular headlamp.

13 Claims, 13 Drawing Sheets

OTHER PUBLICATIONS

Patent Abstracts of Japan, Publication No. 2002-094129 dated Mar. 29, 2002, 1 pg.
Great Britain Examination Report dated Nov. 25, 2004, 1 page.
Great Britain Combined Search and Examination Report dated Jul. 15, 2004, 6 pages.
Korean Office Action for Korean Application No. 10-2004-0008251 mailed on Aug. 26, 2005, 3 pages.
Patent Abstracts of Japan, Publication No.: 04-039137, Publication Date: Feb. 10, 1992, 2 pages.
Patent Abstracts of Japan, Publication No.: 2002-184219, Publication Date: Jun 28, 2002, 2 pages.
English Abstract of Korean Patent Application publication No. 1999-0063152, 1 page.

* cited by examiner

VEHICULAR HEADLAMP AND OPTICAL UNIT

This patent application claims priority from a Japanese patent application No. 2003-032097 filed on Feb. 10, 2003, the contents of which are incorporated herein by reference.

BACKGROUND OF THE INVENTION

1. Field of the Invention

The present invention relates to a vehicular headlamp and an optical unit. More particularly, the present invention relates to a vehicular headlamp for use in an automobile.

2. Description of the Related Art

A vehicular headlamp including, for example, regular headlamp, fog lamp and cornering lamp for automobiles, trains, motorcycles or the like has to form a light distribution pattern with high precision from safety reasons. A method is conventionally known in which an optical system including a reflector and a lens is used to form distribution of light to be formed by the vehicular headlamp as disclosed, for example, in Japanese Patent Application Publication (Laid-Open) No. 2002-50214.

In the vehicular headlamp, however, it is necessary to assemble the reflector and the lens in order to place them in appropriate positions with high precision. Therefore, according to the conventional method, the assembly cost of the vehicular headlamp increased in some cases.

SUMMARY OF THE INVENTION

Therefore, it is an object of the present invention to provide a vehicular headlamp and an optical unit, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp for use in an automobile, comprises: a light source operable to generate light; a light transmitting member formed from material transmitting the light; a reflector, formed on at least a part of a surface of the light transmitting member, operable to reflect the light incident via the light transmitting member from the light source, the reflector having an optical center near the light source; and a lens, formed integrally with the light transmitting member, operable to deflect the light reflected by the reflector to direct the light to an outside of the vehicular headlamp.

The light source may include a semiconductor light emitting device, and the light transmitting member may have an accommodating portion near the optical center operable to accommodate at least a part of the light source to be opposed to at least a part of the reflector.

The light source may further include a sealing member formed from material transmitting the light, operable to seal the semiconductor light emitting device, the accommodating portion may accommodate at least a part of the sealing member, and a refractive index of the light transmitting member may be approximately equal to or larger than a refractive index of the sealing member.

The vehicular headlamp may emit light ahead of the automobile, the light transmitting member may transmit the light reflected by the reflector ahead, a light blocking member formed from material transmitting no light generated by the light source integrally with the light transmitting member may be further provided for blocking a part of the light transmitted ahead by the light transmitting member at an edge, the reflector may reflect the light generated by the light source toward a position near the edge of the light blocking member, and the lens may irradiate light that forms at least a part of a cut line for defining a boundary between a bright region and a dark region in a light distribution pattern of the vehicular headlamp based on a shape of at least a part of the edge of the light blocking member.

The reflector may be a first reflector, formed to cover the light source from behind, operable to reflect the light generated by the light source to a position near a front edge of the light blocking member, and the light blocking member may be formed by a second reflector provided on a part of the surface of the light transmitting member to be opposed to the first reflector with the light transmitting member sandwiched therebetween.

The reflector may be formed of metal deposited on at least a part of the surface of the light transmitting member. Moreover, the light source may include a semiconductor light emitting device, and the light transmitting member may seal the semiconductor light emitting device.

According to the second aspect of the present invention, a vehicular headlamp for emitting light ahead, comprises: a light source operable to generate light; a light transmitting member, formed from material transmitting the light, operable to transmit the light generated by the light source ahead; alight blocking member, formed from material transmitting no light generated by the light source integrally with the light transmitting member, operable to block a part of the light transmitted ahead by the light transmitting member at an edge; and a lens, formed integrally with the light transmitting member, operable to irradiate light forming at least a part of a cut line that defines a boundary between a bright region and a dark region in a light distribution pattern of the vehicular headlamp based on a shape of at least a part of the edge of the light blocking member.

According to the third aspect of the present invention, an optical unit for irradiating light generated by a light source, comprises: a light transmitting member formed from material transmitting the light; a reflector, formed on at least a part of a surface of the light transmitting member, operable to reflect the light incident via the light transmitting member from the light source, the reflector having an optical center near the light source; and a lens, formed integrally with the light transmitting member, operable to deflect the light reflected by the reflector to direct the light to an outside of the optical unit.

According to the fourth aspect of the present invention, an optical unit for irradiating light generated by a light source, comprises: a light transmitting member, formed from material transmitting the light, operable to transmit the light generated by the light source ahead; a light blocking member, formed from material transmitting no light generated by the light source integrally with the light transmitting member, operable to block a part of the light transmitted ahead by the light transmitting member at an edge; and a lens, formed integrally with the light transmitting member, operable to irradiate light forming a cut line in a light distribution pattern of a vehicular headlamp based on a shape of at least a part of the edge of the light blocking member.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

For example, the vehicular headlamp to which the present invention may include, but not limited to, regular headlamp, fog lamp and cornering lamp for automobiles, trains, motorcycles or the like.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
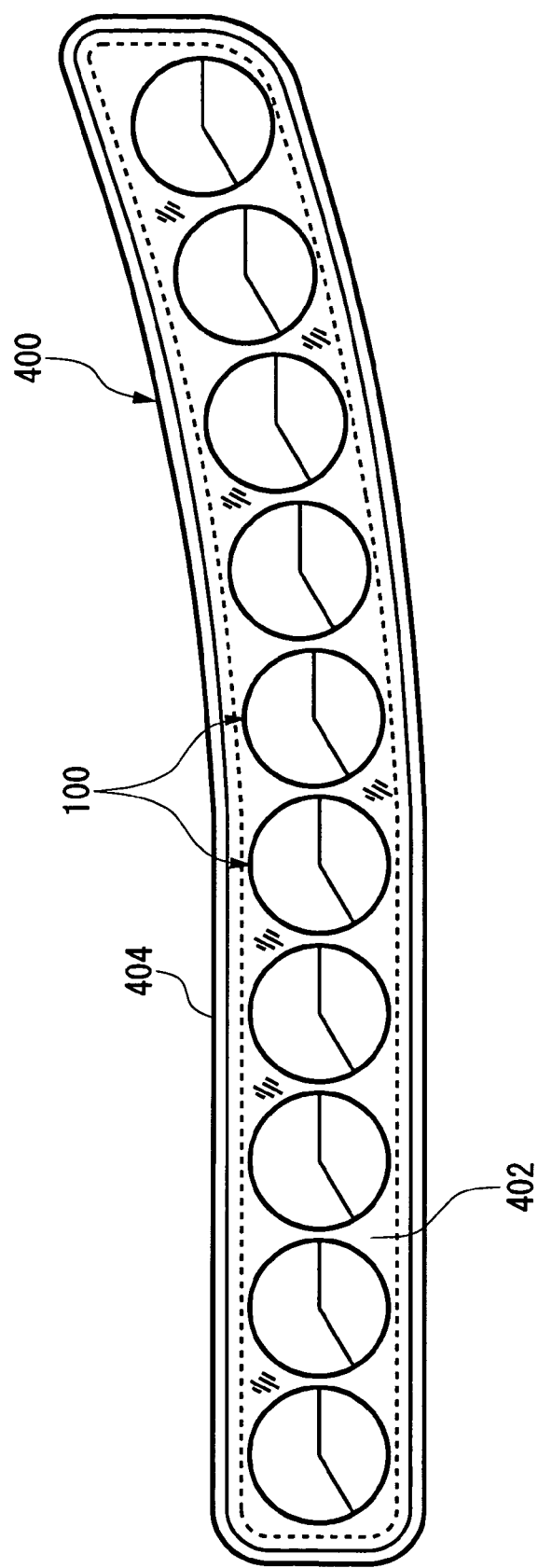
FIG. 1 illustrates an exemplary structure of an vehicular headlamp according to an embodiment of the present invention.

FIG. 1 illustrates an exemplary structure of an vehicular headlamp 400 according to an embodiment of the present invention. This example aims to provide the vehicular headlamp 400 having high optical precision at a low cost. The vehicular headlamp 400 is a vehicular headlamp for emitting a low beam and accommodates a plurality of light source unit 100 arranged in a substantially horizontal line within a lamp chamber formed by a transparent cover 402 and a lamp body 404.

Those light source units 100 have the same or similar structure and are accommodated in the lamp chamber in such a manner that optical axes thereof are at a downward angle of about 0.2° to about 0.4° with respect to a direction approximately parallel to the forward-moving direction of an automobile.

The vehicular headlamp 400 irradiates light ahead of the automobile based on light emitted by those light source units 100, thereby forming a predetermined light distribution pattern. The vehicular headlamp 400 may include a plurality of light source units 100 each having different light distribution characteristics.

Figure 2:
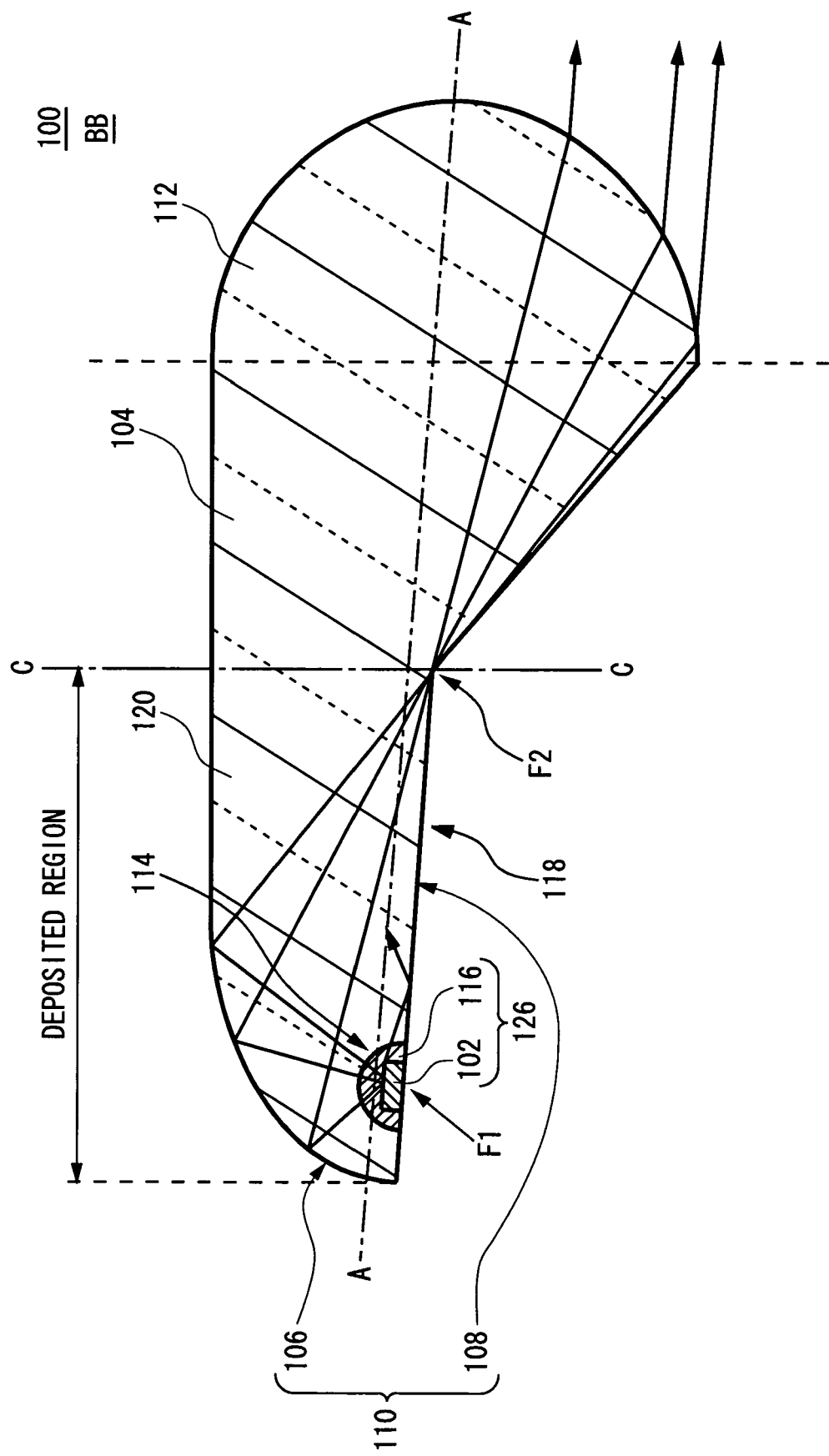
FIG. 2 is a cross-sectional view of an exemplary light source unit, taken along B—B vertical plane.
Figure 3:
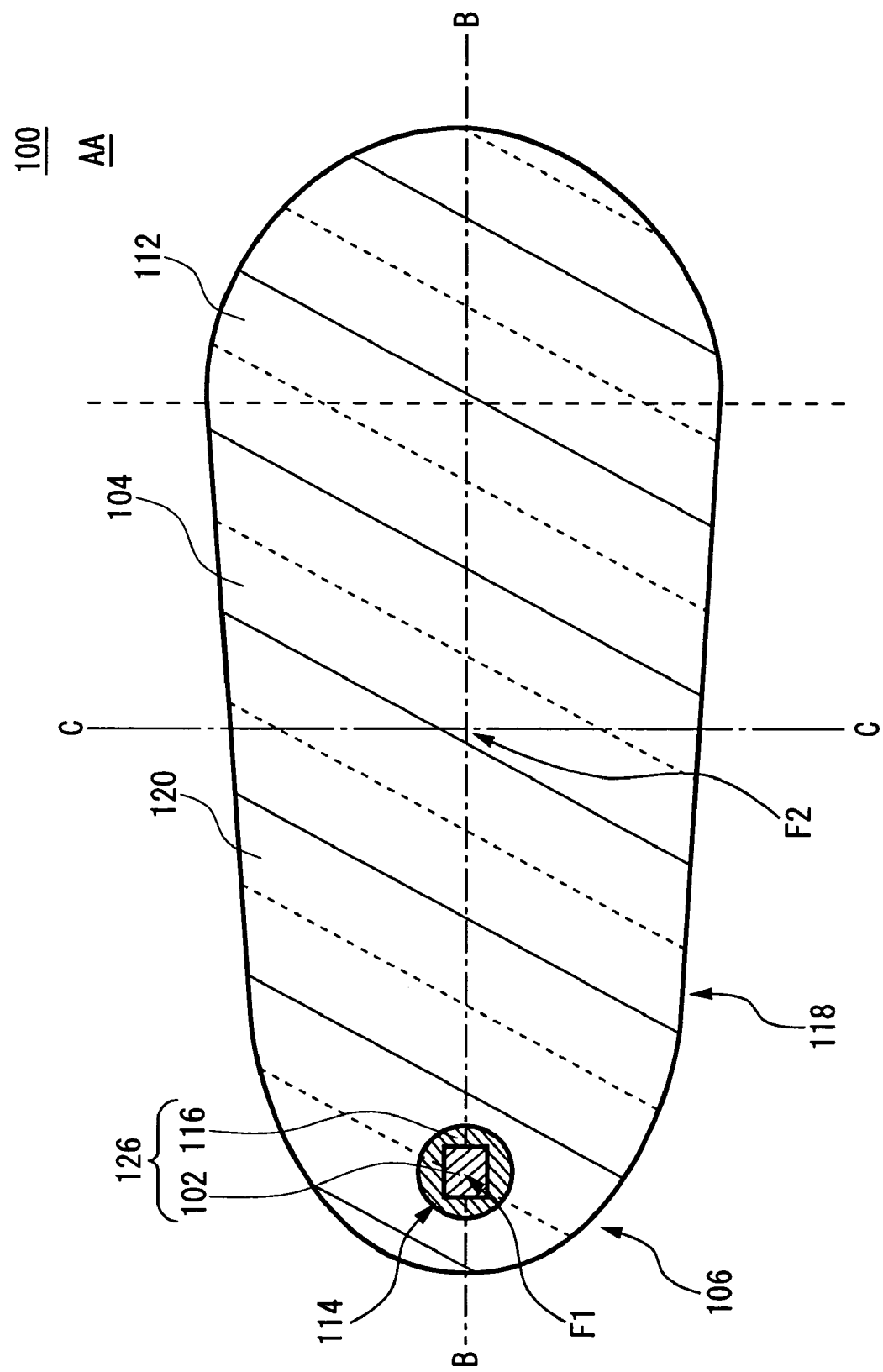
FIG. 3 is a cross-sectional view of the light source unit shown in FIG. 2, taken along A—A horizontal plane.

FIGS. 2 and 3 illustrate an exemplary structure of the light source unit 100. FIG. 2 is a cross-sectional view of the light source unit 100 taken along B—B vertical plane, while FIG. 3 is a cross-sectional view thereof taken along A—A horizontal plane. The light source unit 100 of this example is a projector-type light source unit that emits light reflected and converged at a position near the optical axis, forward via a lens. The light source unit 100 includes a light source 126, a light transmitting member 118 for holding the light source 126 and a reflecting portion 110 formed on a part of a surface of the light transmitting member 118.

The light source 126 is a light emitting diode module that generates white light and includes a semiconductor light emitting device 102 and a sealing member 116. In this example, the semiconductor light emitting device 102 is a light emitting diode device (LED) for generating blue light, which irradiates phosphors (not shown) provided on its surface with the blue light so as to cause the phosphors to generate yellow light that is complementary color of the blue light. In this case, the light source 126 generates white light based on the blue light and the yellow light thus generated by the semiconductor light emitting device 102 and the phosphors, respectively. In another example, the semiconductor light emitting device 102 may generate white light by irradiating the phosphors with ultraviolet light.

The sealing member 116 is an approximately hemispherical molded part formed from material that transmits white light, such as transparent resin, and seals the semiconductor light emitting device 102. The light transmitting member 118 includes a rear edge portion 120, an intermediate portion 104 and a lens 112. The rear edge portion 120, the intermediate portion 104 and the lens 112 are formed integrally from material that transmits white light, such as transparent resin or glass.

The rear edge portion 120 is formed to cover the light source 126 and transmits light generated by the light source 126 forward toward the lens 112. The rear edge portion 120 includes an accommodating portion 114 inform of an approximately hemispherical hollow that has an opening formed in the lower surface of the rear edge portion 120 and extends upward, i.e., toward the inside of the rear edge portion 120. The accommodating portion 114 accommodates at least a part of the sealing member 116, thereby accommodating at least a part of the light source 126 to be opposed to at least a part of the reflecting portion 110.

The accommodating portion 114 holds the light source 126 in position in such a manner that the light source 126 faces substantially upward by bringing the inner wall of the accommodating portion 114 into substantial contact with the outer surface of the sealing member 116. Thus, it is possible to fix the light source 126 with high precision. Alternatively, the accommodating portion 114 may be a hollow formed in the upper surface or side face of the rear edge portion 120 to extend toward the inside of the rear edge portion 120. In this case, the light source 126 may be supported to face down or sideways.

It is preferable that the refractive index of the rear edge portion 120 be approximately equal to or larger than that of the sealing member 116. The rear edge portion 120 may be formed from the same resin as the sealing member 116, for example. In this manner, it is possible to reduce a ratio of light reflected by the surface of the accommodating portion 114 among light generated by the semiconductor light emitting device 102. A gap between the accommodating portion 114 and the sealing member 116 may be filled with transparent resin having approximately equal refractive index to those of the accommodating portion 114 and the sealing member 116, for example. Moreover, the sealing member 116 may be formed integrally with the rear edge portion 120.

The lower surface of the rear edge portion 120 is arranged substantially horizontally. The rear face of the rear edge portion 120 has a substantially ellipsoidal shape formed to curve from the rear edge of the lower surface upward in the forward direction. This substantially ellipsoidal is determined in such a manner that a cross-sectional shape of the light source unit 100 containing the optical axis is formed by at least a part of an approximate ellipsoid. The eccentricity of the approximate ellipsoid is determined to gradually increase from the vertical cross section to the horizontal cross section. Please note that the light source unit 100 has its optical axis extending substantially ahead of the automobile around the center of the lower surface of the rear edge portion 120.

The intermediate portion 104 is formed to extend from the front edge of the rear edge portion 120 to the rear edge of the lens 112, and transmits light generated by the light source 126 toward the inside of the rear edge portion 120, to the lens 112. In this example, the lower surface of the intermediate portion 104 is formed to be tilted downward in the forward direction in order to efficiently transmit light reflected by the reflecting portion 110 to the lens 112.

The lens 112 is a convex lens formed to extend from the front edge of the intermediate portion 104 ahead so as to be positioned in front of the light source unit 100. The lens 112 deflects light reflected by the reflecting portion 110 to direct it to the outside of the light source unit 100. In this example, the lens 112 is formed integrally with a part of the light transmitting member 118, thereby being formed integrally with the light transmitting member 118. Thus, according to this example, the position of the lens 112 can be set with high precision.

In an alternative example, the lens 112 may be provided separately from the rear edge portion 120 and the intermediate portion 104. In this case, the lens 112 is formed integrally with the light transmitting member 118 by being attached to the light transmitting member 118 including the rear edge portion 120 and the intermediate portion 104. Also in this case, the position of the lens 112 can be set with high precision.

The reflecting portion 110 is a reflector formed of metal deposited on at least a part of a surface of the rear edge portion 120 and reflects light generated by the light source 126. Please note that no metal is deposited on the surface of the intermediate portion 104 and lens 112 and therefore no reflector is formed on the surface of the intermediate portion 104 and lens 112.

The reflecting portion 110 includes reflectors 106 and 108. The reflector 108 is formed on at least a part of the lower surface of the rear edge portion 120 to extend substantially horizontal in such a manner that the reflector 108 is opposed to the other reflector 106 with the rear edge portion 120 sandwiched therebetween. The reflector 108 reflects light generated by the light source 126 and light reflected downward by the reflector 106, upward.

The reflector 108 is formed of metal that transmits no light generated by the light source 126. Thus, in this example, the reflector 108 also serves as a light blocking member (shade) formed integrally with the rear edge portion 120. The reflector 108 blocks a part of the light transmitted by the rear edge portion 120 downward in the forward direction at its front edge, thereby forming a boundary between a bright region and a dark region in accordance with the shape of the front edge.

The reflector 106 is a combined elliptical reflector having a shape containing at least a part of a substantially ellipsoidal, and is formed on at least a part of the upper and rear surface of the rear edge portion 120 in such a manner that the reflector 106 extends from a position near the rear edge of the reflector 108 upward in the forward direction so as to cover the light source 126. The reflector 106 has its optical center, such as a reference point in optical design, near the light source 126. The reflector 106 reflects light incident from the light source 126 via the rear edge portion 120, toward a position near the front edge of the reflector 108. The reflector 106 is formed in form of a curved plane having a focus at that optical center.

Next, the positional relationship among the light source 126, the reflector 106 and the lens 112 is described in more detail. In this example, the reflector 106 has a focus F1 and a focus F2 approximately on the reflector 108, and reflects light incident from the focus F1 toward the focus F2 positioned before the focus F1. The reflector 106 may have the focus F1 at the position of its optical center.

In this example, the opening of the accommodating portion 114 is provided in the lower surface of the rear edge portion 120 near the focus F1. Thus, the accommodating portion 114 supports the light source 126 near the focus F1 to be opposed to the reflector 106. In this case, the semiconductor light emitting device 102 is arranged near the focus F1.

The reflector 106 has the focus F2 on the front edge of the reflector 108 near the center in the transverse direction. Thus, the reflector 106 substantially converges at least most of the light generated by the semiconductor light emitting device 102 at a position near the center of the front edge of the reflector 108.

The respective parts of the reflector 106, that is a combined elliptical reflector, may be formed by curved planes having a common focus F1 and different focuses F2 that are set at different positions near the front edge of the reflector 108. For example, a front part of the reflector 106, that is a part close to the front of the automobile, may have the focus F2 positioned closer to the front of the automobile than the focus F2 of a rear part of the reflector 106 that is a part close to the rear of the automobile.

The lens 112 irradiates light generated by the semiconductor light emitting device 102 ahead of the automobile. In this example, the lens 112 has its focus near the center of the front edge of the reflector 108. In this case, the lens 112 irradiates the light substantially converted at a position near the center ahead of the automobile as substantially collimated light. The lens 112 may irradiate light converged at the focus F2 of the reflector 106 along the direction of the optical axis.

As described above, the reflector 106 is formed on the surface of the light transmitting member 118 formed integrally with the lens 112. The light source 126 is held within the accommodating portion 114 formed in the light transmitting member 118. Therefore, according to this example, it is possible to precisely set the positions of the light source 126, the reflector 106 and the lens 112 without an assembly process requiring high precision.

Moreover, in that manner, the reflector 106 converges light generated by the light source 126 at a position near the center of the front edge of the reflector 108 with high precision. The lens 112 irradiates the light converged at the position near the center of the front edge of the reflector 108, forward with high precision. Therefore, according to this example, it is possible to form light distribution pattern with high precision.

In addition, since the reflector 106, the lens 112 and the like are formed integrally, the number of parts to be assembled and the number of man-hour of assembly work can be reduced. Therefore, according to this example, it is possible to provide a vehicular headlamp formed by a reduced number of parts that has high optical precision at a low cost.

Furthermore, according to this example, the light source unit 100 incorporating the semiconductor light emitting device 102 therein can be provided by a simple structure. In this case, simplification of the structure leads to the size reduction in the light source unit 100. According to this example, the length in the light source unit 100 in the traveling (or forward-moving) direction of the automobile can be reduced to about 50–70 mm, for example, while the width of the reflector 106 in the transverse direction can be reduced to about 20–30 mm, for example. In this case, the use of a number of light source units 100 is allowed. Therefore, by combining a plurality of light source units 100 having different light distribution characteristics, it is possible to design light distribution easily and flexibly.

In another example, in place of the sealing member 116, the light transmitting member 118 may seal the semiconductor light emitting device 102 directly. In this case, light generated by the semiconductor light emitting device 102 can be supplied to the light transmitting member 118 efficiently. Moreover, the semiconductor light emitting device 102 may be a semiconductor laser. The light transmitting member 118, the reflecting portion 110 and the lens 112 may form an optical unit that deflects light generated by the light source 126.

In still another example, the light transmitting member 118 may be formed from colored and transparent material. In this case, the light source unit 100 emits colored light based on the color of that material. For example, the light source unit 100 may be used in a fog headlamp that emits yellow light. In this case, the light transmitting member 118 may be formed from yellow transparent material. Alternatively, the light source unit 100 may be used in a rear fog lamp that emits red light. In this case, the light transmitting member 118 may be formed from red transparent material.

Figure 4:
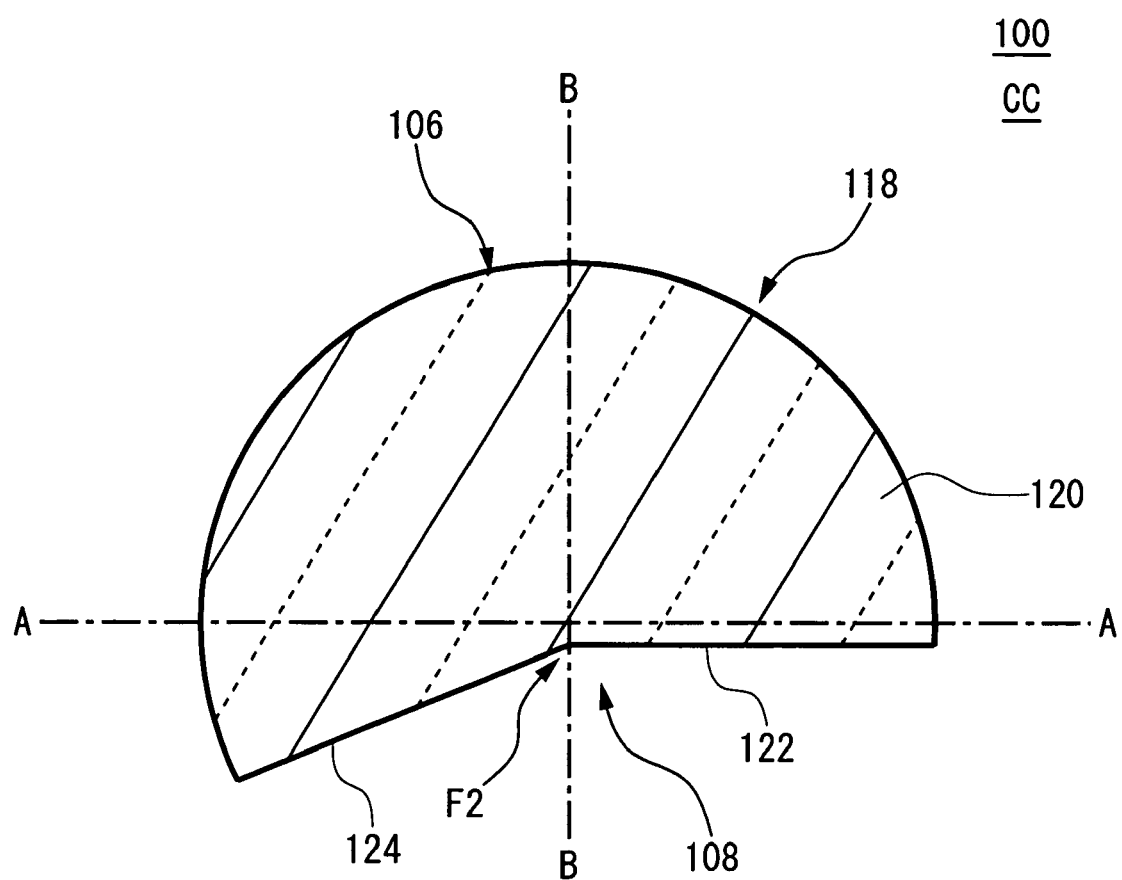
FIG. 4 is across-sectional view of the light source unit shown in FIG. 2, taken along C—C plane.

FIG. 4 is a cross-sectional view of the light source unit 100 taken along C—C vertical plane that is perpendicular to the traveling direction of the automobile. In this example, the reflector 108 includes a horizontal cut-off formed surface 122 and a diagonal cut-off formed surface 124, as shown in FIG. 4. The horizontal cut-off formed surface 122 extends from the optical axis of the light source unit 100 in the horizontal direction toward the left in FIG. 4. On the other hand, the diagonal cut-off formed surface 124 extends from the optical axis of the light source unit 100 toward the right in FIG. 4 in such a manner that that extending direction is at a downward angle of 15° with respect to the horizontal direction. The reflector 108 contains the focus F2 on the front end thereof near the boundary between the horizontal cut-off formed surface 122 and the diagonal cut-off formed surface 124. Thus, the front edge of the reflector 108 is formed to extend from its center positioned around the focus F2 to right and left sides of the optical axis of the vehicular headlamp 400 (see FIG. 1) so as to turn both ends of the front edge of the reflector 108 down.

In this case, the reflector 106 converges light generated by the light source 126 at a position near the front edge of the reflector 108 having the above-mentioned shape. Therefore, the lens 112 (see FIG. 2) irradiates light forming at least a part of a cut line that defines a boundary between a bright region and a dark region in the light distribution pattern of the vehicular headlamp 400, based on the shape of a least a part of the front edge of the reflector 108. According to this example, the front edge of the reflector 108 is formed with high positional precision with respect to the light source 126 (see FIG. 2), the reflector 106, the lens 112 (see FIG. 2) and the like. Therefore, it is possible to form a clear cut line surely.

Figure 5:
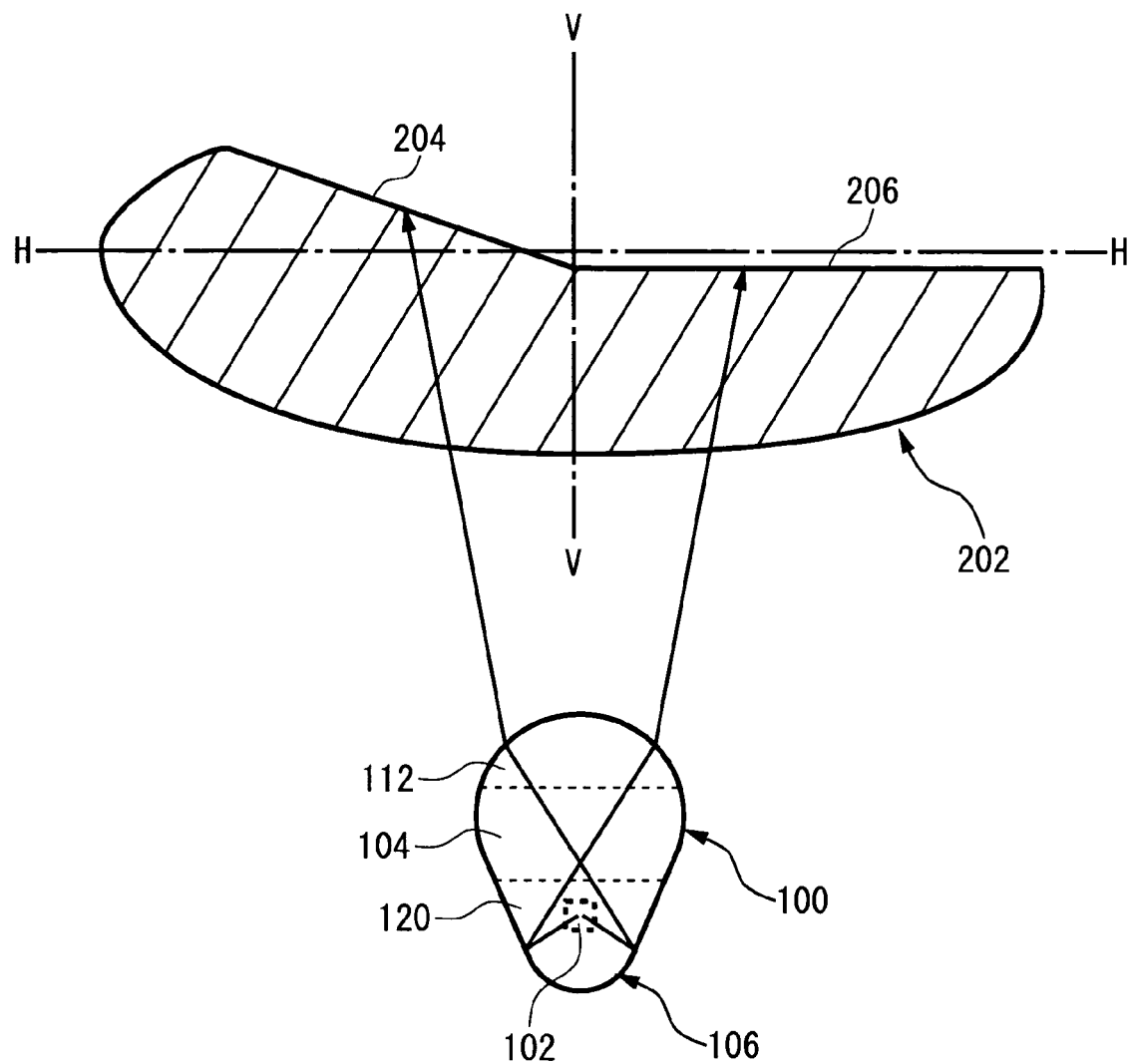
FIG. 5 shows an exemplary light distribution pattern.

FIG. 5 is a perspective diagram showing an exemplary light distribution pattern 202 formed by the light source unit 100 together with the light source unit 100 seen from behind. The light distribution pattern 202 is a low-beam light distribution pattern formed on a virtual vertical screen arranged at a position 25 meters ahead of the light source unit 100.

In this example, the light source unit 100 projects an image of a plane containing the front edge of the reflector 108 onto the virtual vertical screen, so as to form the light distribution pattern 202 having a horizontal cut line 20 and a diagonal cut line 204. The light source unit 100 forms the horizontal cut line 206 based on the shape of the front edge of the horizontal cut-off formed surface 122 (see FIG. 4) while forming the diagonal cut line 204 based on the shape of the front edge of the diagonal cut-off formed surface 124 (see FIG. 4). According to this example, it is possible to surely form clear cut lines.

In another example, the vehicular headlamp 400 (see FIG. 1) may form the light distribution pattern 202 based on light generated by a plurality of light source units 100 each having different light distribution characteristics. In this case, each light source unit 100 may irradiate a region corresponding to a part of the light distribution pattern 202 with light.

Figure 6:
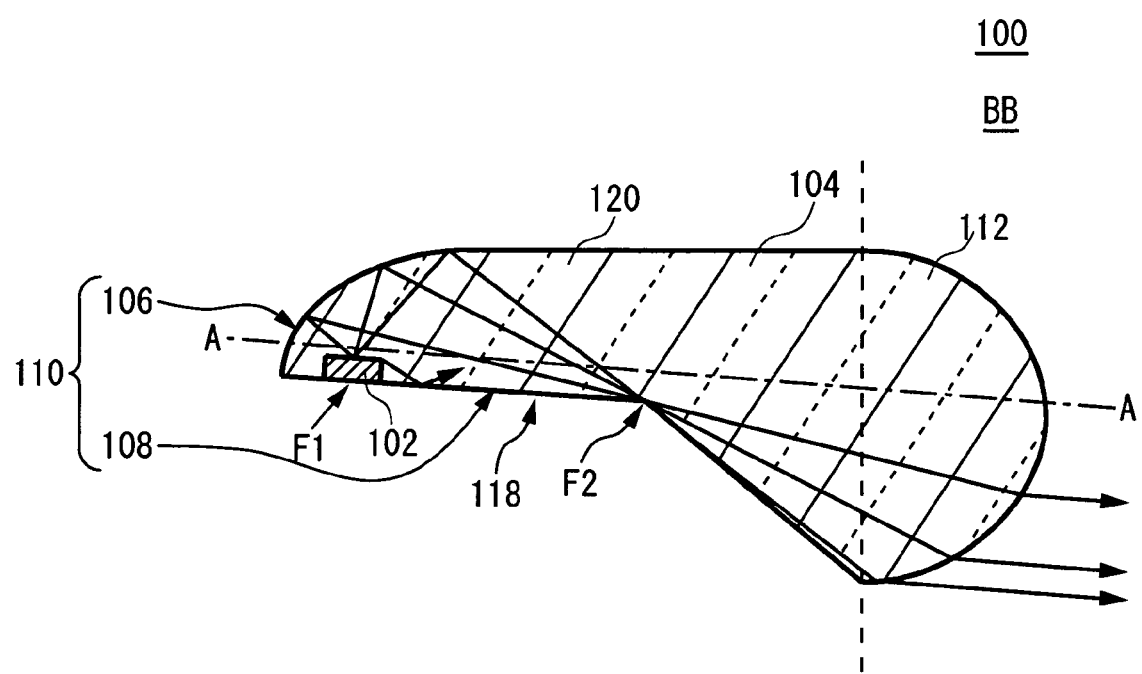
FIG. 6 is a cross-sectional view of another exemplary light source unit, taken along B—B vertical plane.
Figure 7:
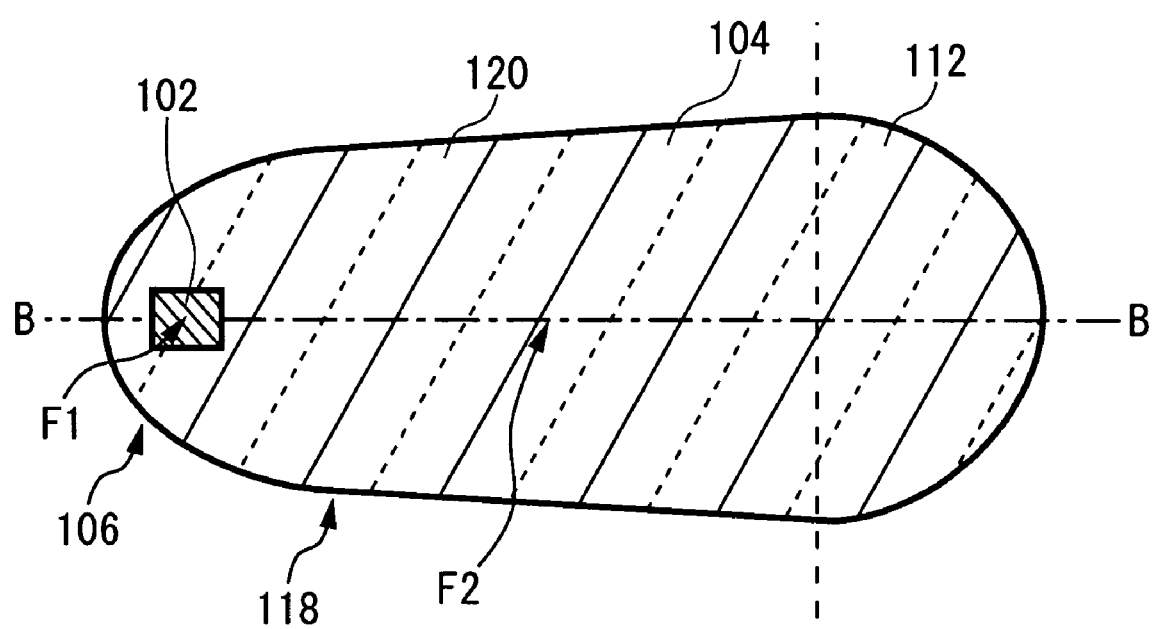
FIG. 7 is across-sectional view of the light source unit shown in FIG. 6, taken along A—A horizontal plane.

FIGS. 6 and 7 illustrate another exemplary structure of the light source unit 100. FIG. 6 is a cross-sectional view of the light source unit 100 taken along B—B vertical plane, while FIG. 7 is a cross-sectional view thereof taken along A—A horizontal plane.

In this example, the light transmitting member 118 further has the same or similar function as/to that of the sealing member 116 (see FIG. 2) and therefore seals the semiconductor light emitting device 102. In this case, since the light transmitting member 118 has the same or similar function as/to that of molded resin in the light emitting diode module, it is possible to make light generated by the semiconductor light emitting device 102 incident on the light transmitting member 118 with high efficiency. Moreover, since the light transmitting member 118 that includes the lens 112 as a part thereof seals the semiconductor light emitting device 102, the lens 112 can irradiate the light generated by the semiconductor light emitting device 102 ahead of the automobile with high efficiency.

Furthermore, according to this example, the light transmitting member 118 seals the semiconductor light emitting device 118 directly. Therefore, it is possible to form a compact light source unit 100. For example, the light source unit 100 can be formed using the lens 112 having a smaller diameter, such as a diameter of about 10 mm. In addition, according to this example, it is possible to provide the light source unit 100 at a lower cost because the number of the parts of the light source unit 100 can be further reduced. Except for the above, the components in FIGS. 6 and 7 having the same reference numerals as those in FIGS. 2 and 3 have the same or similar functions as/to those of the components in FIGS. 2 and 3 and therefore the description thereof is omitted.

Figure 8:
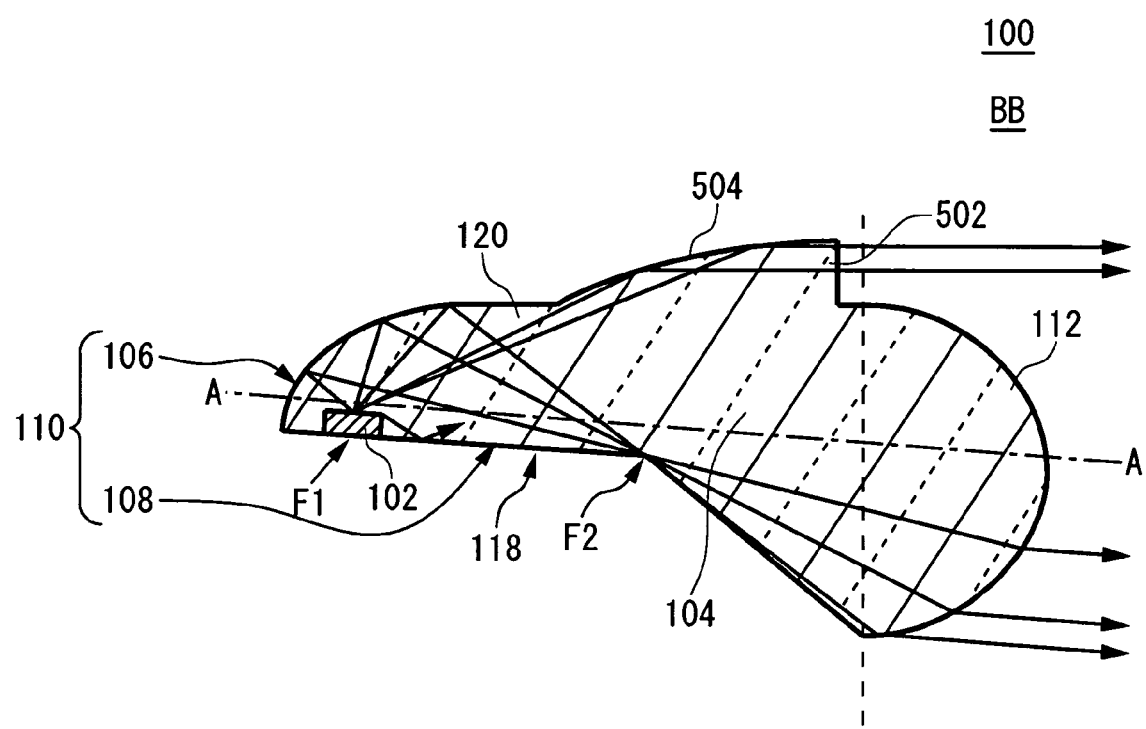
FIG. 8 is a cross-sectional view of still another exemplary light source unit, taken along B—B vertical plane.
Figure 9:
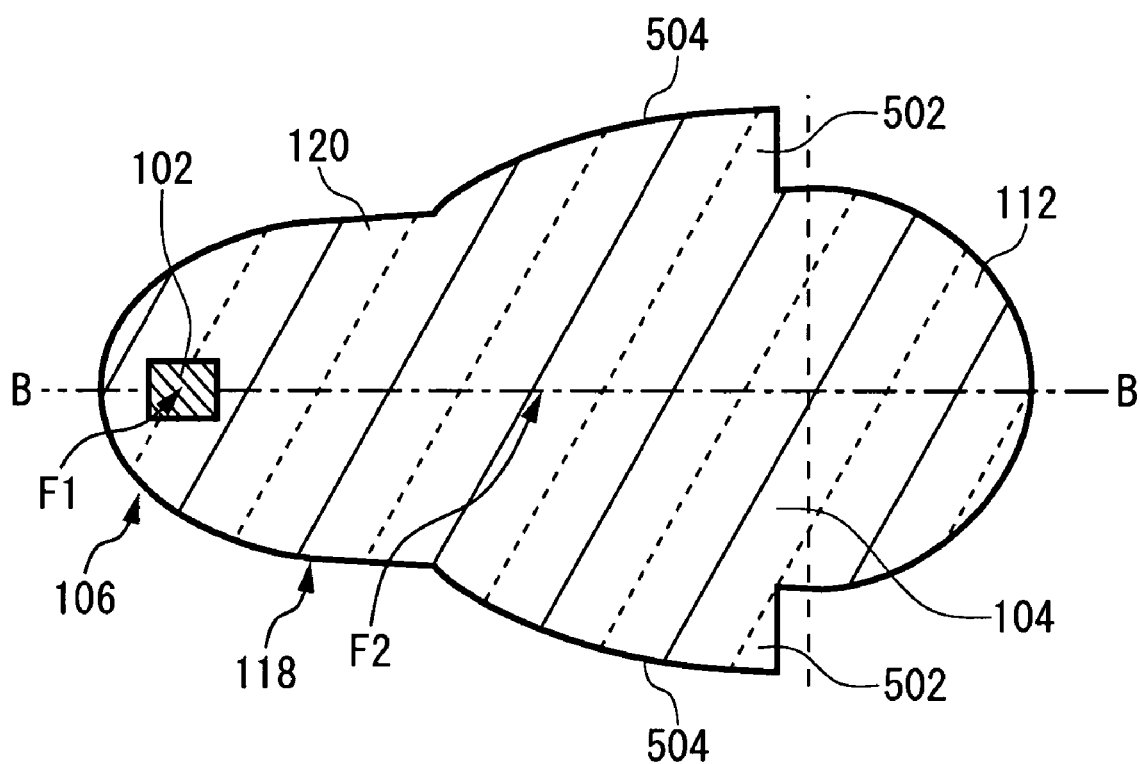
FIG. 9 is a cross-sectional view of the light source unit shown in FIG. 8, taken along A—A horizontal plane.

FIGS. 8 and 9 illustrate still another example of the structure of the light source unit 100. FIG. 8 is a cross-sectional view of the light source unit 100 taken along B—B vertical plane, while FIG. 9 is a cross-sectional view thereof taken along A—A horizontal plane.

In this example, the intermediate portion 104 includes an outer peripheral portion 502 and a reflector 504, as shown in FIGS. 8 and 9. The outer peripheral portion 502 is formed in a region connecting the front edge of the rear edge portion 120 and the rear edge of the lens 112 to protrude towards the outside of the intermediate portion 104. The reflector 504 is formed on the surface of the outer peripheral portion 502 by, for example, deposition of metal. The surface of the outer peripheral portion 502 is formed to extend forward from the front edge of the rear edge portion 120 in such a manner that a distance from the optical axis of the light source unit 100 gradually increases. The front edge of the outer peripheral portion 502 is a substantially vertical transparent face that extends from a position near the rear edge of the lens 112 toward a direction away from the optical axis of the light source unit 100. The outer peripheral portion 502 may be formed in a region positioned on a higher level than the horizontal plane substantially containing the lower surface of the rear edge portion 120, for example.

The outer surface of the outer peripheral portion 502 has a shape corresponding to a part of an approximate paraboloid of revolution having a focus positioned near the semiconductor light emitting device 102. In this case, the reflector 504 reflects light generated by the semiconductor light emitting device 102 forward as substantially collimated light. The reflector 504 makes the reflected light pass through the front edge face of the outer peripheral portion 502 and makes that light travel forward. The reflector 504 may be formed integrally with the reflecting portion 110.

According to this example, the semiconductor light emitting device 102 can emit light forward with high efficiency. Except for the above, the components in FIGS. 8 and 9 having the same reference numerals as those in FIGS. 6 and 7 have the same or similar functions as those of the components in FIGS. 6 and 7 and therefore the description thereof is omitted.

Figure 10:
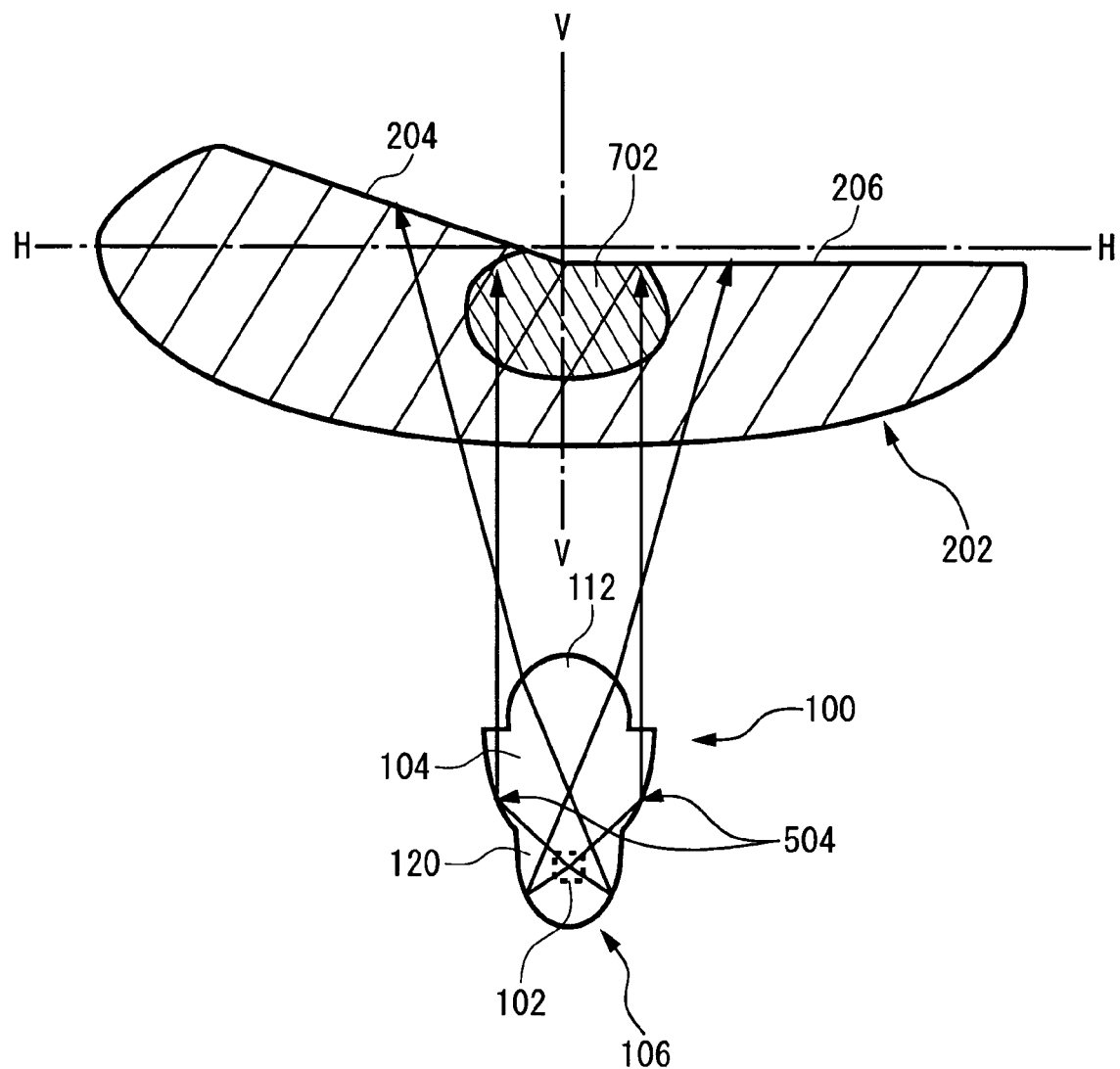
FIG. 10 shows an exemplary light distribution pattern.

FIG. 10 is a perspective diagram showing an exemplary light distribution pattern 202 formed by the light source unit 100 described referring to FIGS. 8 and 9 together with the light source unit 100 seen from behind. In this example, the reflector 504 of the approximate paraboloid of revolution irradiates light generated by the semiconductor light emitting device 102 provided at the position of the focus of the reflector 504 toward a center region 702 near an intersection of the diagonal cut line 204 and the horizontal cut line 206.

Therefore, according to this example, it is possible to irradiate a region near the center of the cut lines with light of higher illuminance. Moreover, this enables the cut lines to be formed clearly more surely. Except for the above, the components in FIG. 10 having the same reference numerals as those in FIG. 5 have the same or similar functions as those of the components in FIG. 5 and therefore the description thereof is omitted.

Figure 11:
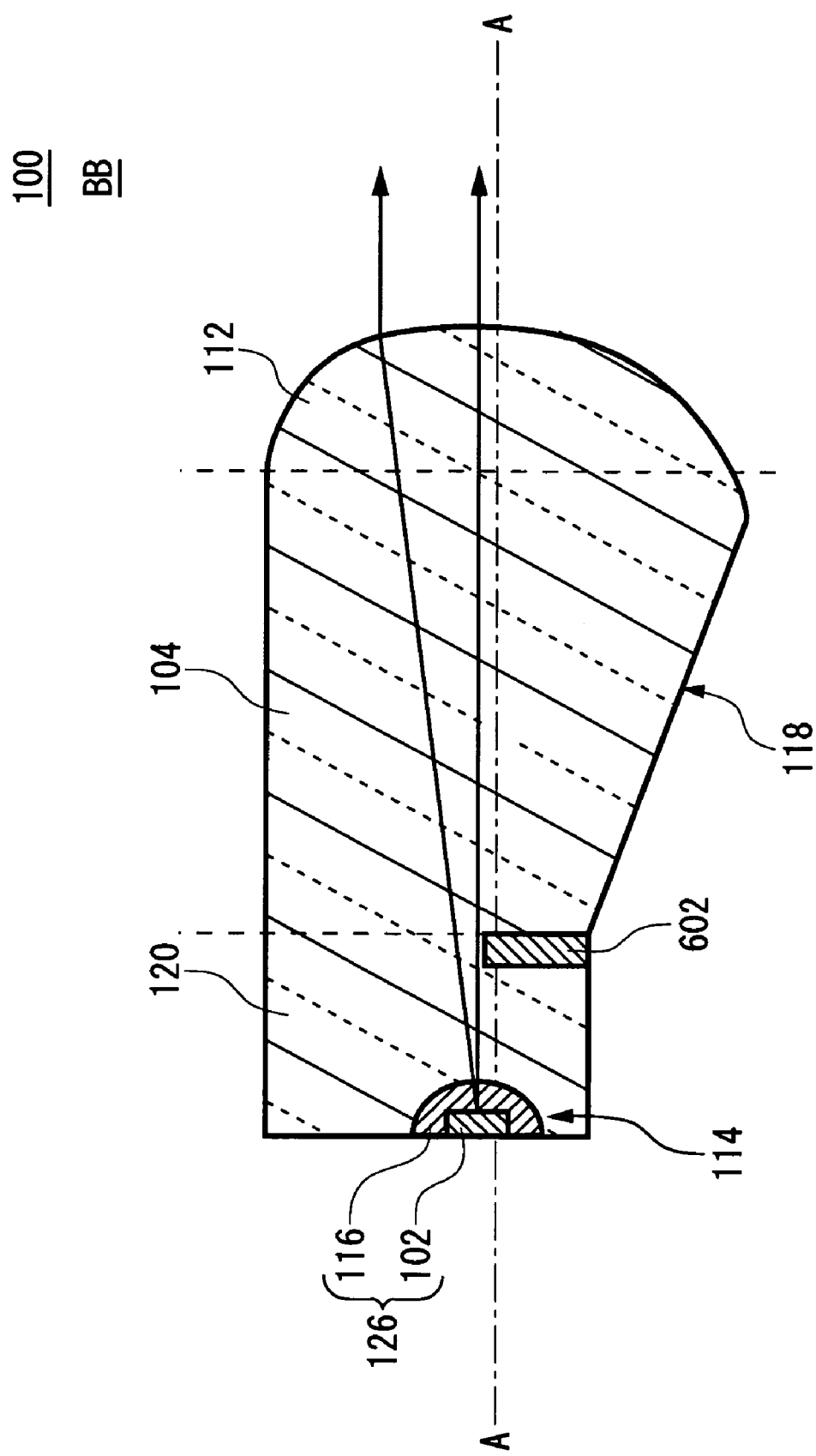
FIG. 11 is a cross-sectional view of still another exemplary light source unit, taken along B—B vertical plane.
Figure 12:
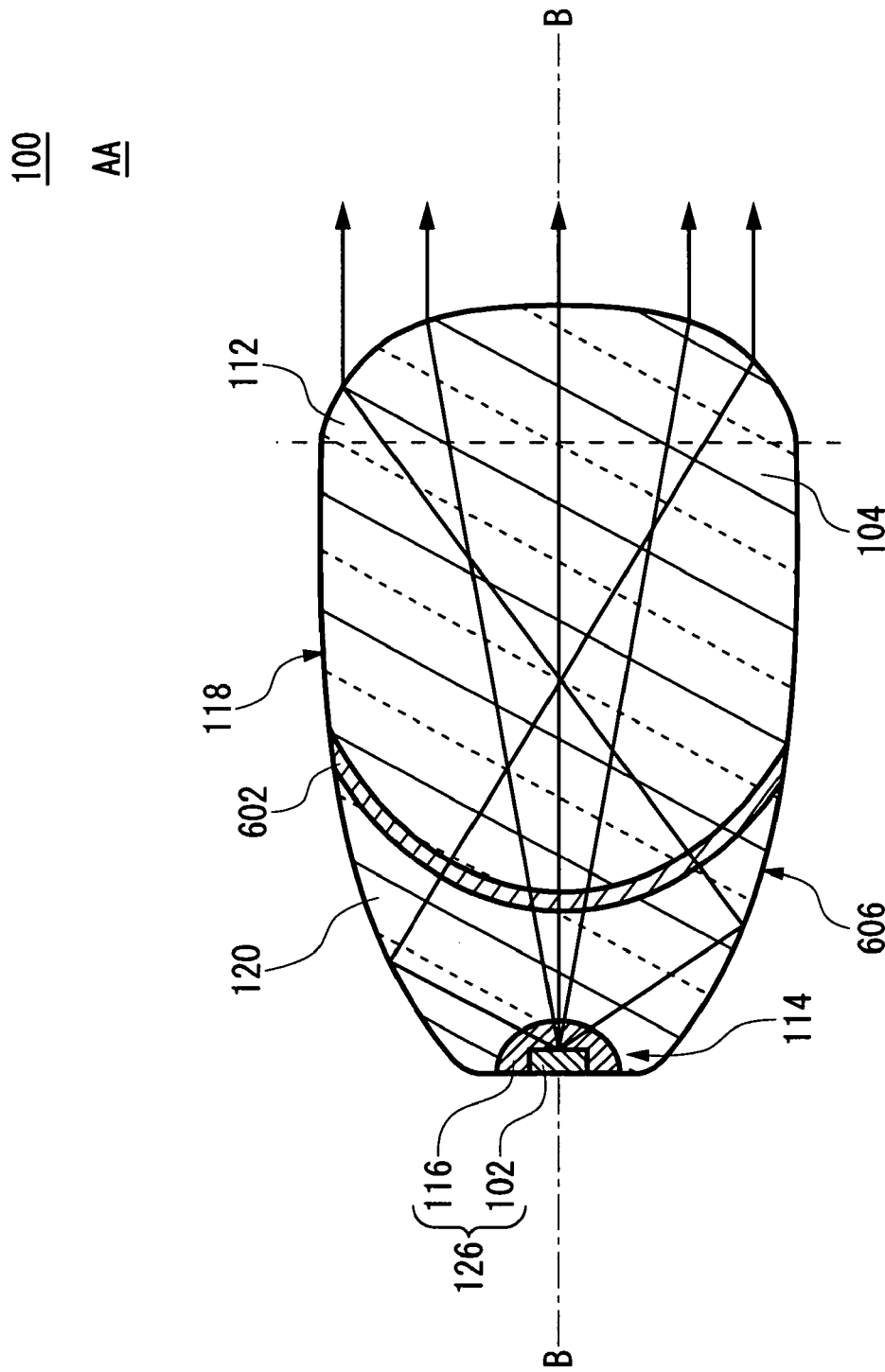
FIG. 12 is a cross-sectional view of the light source unit shown in FIG. 11, taken along A—A horizontal plane.

FIGS. 11 and 12 illustrate still another example of the structure of the light source unit 100. FIG. 11 is a cross-sectional view of the light source unit 100 taken along B—B vertical plane, while FIG. 12 is a cross-sectional view thereof taken along A—A horizontal plane.

In this example, the accommodating portion 114 is formed in form of a hollow extending from the rear edge face ahead, thereby fixing the semiconductor light emitting device 102 in such a manner that the semiconductor light emitting device 102 faces ahead. Therefore, the semiconductor light emitting device 102 emits light ahead.

The light source unit 100 further includes a light blocking member 602 formed integrally with the light transmitting member 118. The light blocking member 602 is formed to extend from the lower surface of the light transmitting member 118 upward, i.e., toward the inside of the light transmitting member 118 and to extend near the lower surface of the light transmitting member 118 in the transverse direction of the automobile (i.e., in a direction from one of right and left sides of the automobile to the other) in such a manner that the light blocking member 602 is curved to protrude backward around the center in its extending direction, for example. The light blocking member 602 blocks a part of light emitted by the semiconductor light emitting device 102 toward the inside of the light transmitting member 118, at its upper edge.

The light blocking member 602 is formed by filling a hollow that is provided from the surface of the light transmitting member 118 toward the inside of the light transmitting member 118, with light blocking material. The light blocking member 602 may be formed by painting the wall surface of that hollow black or the like. The light blocking member 602 and the light transmitting member 118 may be formed integrally by double molding.

The lens 112 has a focus near the upper edge of the light blocking member 602. In this case, the lens 112 irradiates a boundary between a bright region and a dark region based on the shape of the upper edge of the light blocking member 602 forward, thereby forming at least a part of the cut line in the light distribution pattern. Except for the above, the components in FIGS. 11 and 12 having the same reference numerals as those in FIGS. 2 and 3 have the same or similar functions as/to those of the components in FIGS. 2 and 3 and therefore the description thereof is omitted.

In this example, the positions of the semiconductor light emitting device 102, the light blocking member 602 and the lens 112 can be set with high precision. Therefore, the light source unit 100 can form the light distribution pattern with high precision. Moreover, the light source unit 100 can be fabricated at a reduced cost because of the reduction of the number of the parts forming the light source unit 100. Also, the size of the light source unit 100 can be reduced because of simplification of the structure.

In this example, the light source unit 100 further includes a reflector 606 formed on at least a part of the side face of the light transmitting member 118. The reflector 606 reflects light generated by the light source 126 toward the sides of the optical axis of the light source unit 100, forward so as to make the light incident on the lens 112. Thus, it is possible to efficiently use the light generated by the light source 126. The lens 112 may irradiate the light reflected by the reflector 606 toward a region other than the cut line in the light distribution pattern as diffused light, for example. Moreover, the light source unit 100 may further include a reflector, for example, on the upper surface of the light transmitting member 118.

The semiconductor light emitting device 102 may be sealed directly by the rear edge portion 120 in a similar manner to that of the semiconductor light emitting device 102 described referring to FIGS. 6 and 7. In this case, the size of the light source unit 100 can be further reduced.

Figure 13:
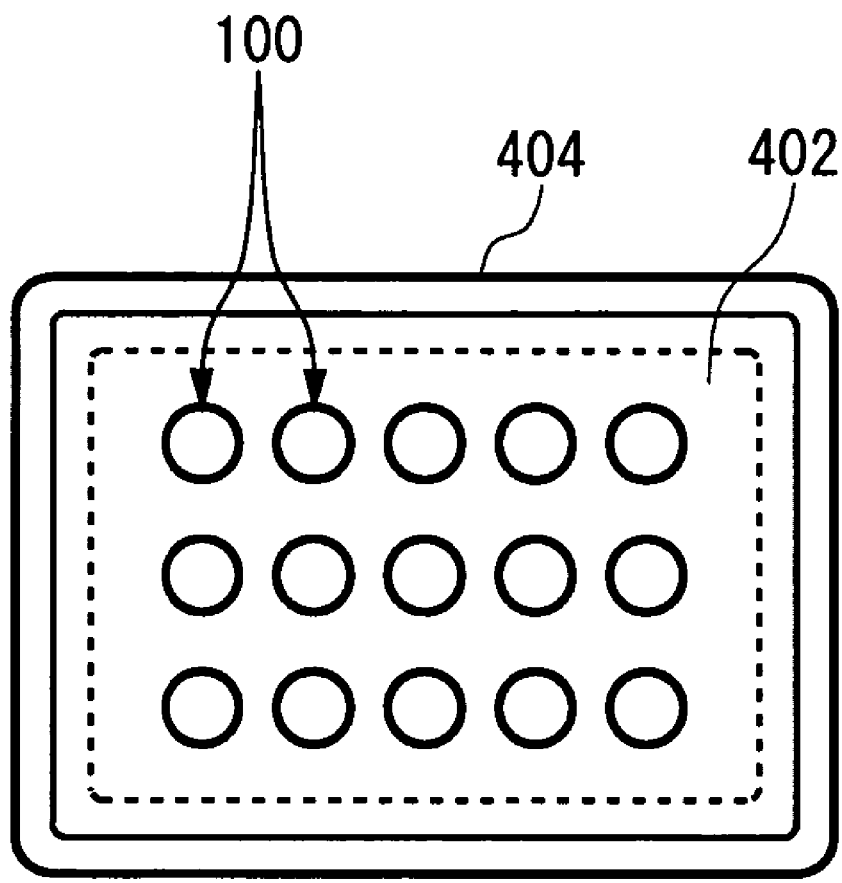
FIG. 13 shows another exemplary structure of the vehicular headlamp.

FIG. 13 illustrates another exemplary structure of the vehicular headlamp 400. In this example, the vehicular headlamp 400 includes a plurality of light source units 100 arranged in an array.

In this example, the light source unit 100 may have the same or similar structure as/to the light source unit 100 described referring to FIGS. 6 and 7, for example. In this case, the diameter of the lens 112 (see FIG. 6) in the light source unit 100 is as small as about 10 mm, for example. Therefore, according to this example, the size of the vehicular headlamp 400 having a number of light source units 100 can be reduced.

In this example, the light distribution characteristics of each of the light source units 100 may be different. In this case, a number of kinds of light source units 100 having different light distribution characteristics can be used. Therefore, according to this example, the design of light distribution of the light source units 100 can be performed easily and flexibly. This also enables an appropriate light distribution pattern to be formed. Except for the above, the components in FIG. 13 having the same reference numerals as those in FIG. 1 have the same or similar functions as/to those of the components in FIG. 1 and therefore the description thereof is omitted.

As is apparent from the above, according to the present invention, the cost of the vehicular headlamp can be reduced.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular headlamp used in an automobile, comprising:
    a light source operable to generate light;
    a light transmitting member formed from material transmitting said light;
    a reflector, formed on at least a part of a surface of said light transmitting member, operable to reflect said light incident via said light transmitting member from said light source, said reflector having an optical center near said light source; and
    a lens, formed integrally with said light transmitting member, operable to deflect said light reflected by said reflector to direct said light to an outside of said vehicular headlamp, wherein
        said vehicular headlamp emits light ahead of the automobile,
        said light transmitting member transmits said light reflected by said reflector ahead,
        a light blocking member formed from material transmitting no light generated by said light source integrally with said light transmitting member is further provided for blocking a part of said light transmitted ahead by said light transmitting member at an edge,
        said reflector reflects said light generated by said light source toward a position near said edge of said light blocking member, and
        said lens irradiates light that forms at least a part of a cut line for defining a boundary between a bright region and a dark region in a light distribution pattern of said vehicular headlamp based on a shape of at least a part of said edge of said light blocking member.

2. A vehicular headlamp as claimed in claim 1, wherein said light source includes a semiconductor light emitting device, and said light transmitting member has an accommodating portion near said optical center, operable to accommodate at least a part of said light source to be opposed to at least a part of said reflector.

3. A vehicular headlamp as claimed in claim 2, wherein said light source further includes a sealing member formed from material transmitting said light, operable to seal said semiconductor light emitting device, said accommodating portion accommodates at least a part of said sealing member, and a refractive index of said light transmitting member is approximately equal to or larger than a refractive index of said sealing member.

4. A vehicular headlamp as claimed in claim 1, wherein said reflector is a first reflector, formed to cover said light source from behind, operable to reflect said light generated by said light source to a position near a front edge of said light blocking member, and said light blocking member is formed by a second reflector provided on a part of said surface of said light transmitting member to be opposed to said first reflector with said light transmitting member sandwiched therebetween.

5. A vehicular headlamp as claimed in claim 1, wherein said reflector is formed of metal deposited on at least a part of said surface of said light transmitting member.

6. A vehicular headlamp as claimed in claim 1, wherein said light source includes a semiconductor light emitting device, and said light transmitting member seals said semiconductor light emitting device.

7. A vehicular headlamp for emitting light ahead, comprising:
    a light source operable to generate light;
    a light transmitting member, formed from material transmitting said light, operable to transmit said light generated by said light source ahead;
    a light blocking member, formed from material transmitting no light generated by said light source integrally with said light transmitting member, operable to block a part of said light transmitted ahead by said light transmitting member at an edge; and
    a lens, formed integrally with said light transmitting member, operable to irradiate light forming at least a part of a cut line that defines a boundary between a bright region and a dark region in a light distribution pattern of said vehicular headlamp based on a shape of at least a part of said edge of said light blocking member.

8. An optical unit for irradiating light generated by a light source, comprising:
    a light transmitting member formed from material transmitting said light;
    a reflector, formed on at least a part of a surface of said light transmitting member, operable to reflect said light incident via said light transmitting member from said light source, said reflector having an optical center near said light source; and
    a lens, formed integrally with said light transmitting member, operable to deflect said light reflected by said reflector to direct said light to an outside of said optical unit, wherein
        said light transmitting member transmits said light reflected by said reflector,
        a light blocking member formed from material transmitting no light generated by said light source integrally with said light transmitting member is further provided for blocking a part of said light transmitted ahead by said light transmitting member at an edge,
        said reflector reflects said light generated by said light source toward a position near said edge of said light blocking member, and
        said lens irradiates light that forms at least a part of a cut line for defining a boundary between a bright region and a dark region in a light distribution pattern of said optical unit based on a shape of at least a part of said edge of said light blocking member.

9. An optical unit for irradiating light generated by a light source, comprising:
- a light transmitting member, formed from material transmitting said light, operable to transmit said light generated by said light source ahead;
- a light blocking member, formed from material transmitting no light generated by said light source integrally with said light transmitting member, operable to block a part of said light transmitted ahead by said light transmitting member at an edge; and
- a lens, formed integrally with said light transmitting member, operable to irradiate light forming a cut line in a light distribution pattern of a vehicular headlamp based on a shape of at least a part of said edge of said light blocking member.

10. A vehicular headlamp used in an automobile, comprising:
- a light source operable to generate light;
- a light transmitting member formed from material transmitting said light;
- a reflector, formed on at least a part of a surface of said light transmitting member, operable to reflect said light incident via said light transmitting member from said light source, said reflector having an optical center near said light source; and
- a lens, formed integrally with said light transmitting member, operable to deflect said light reflected by said reflector to direct said light to an outside of said vehicular headlamp, wherein
  said light source includes a semiconductor light emitting device, and said light transmitting member seals said semiconductor light emitting device.

11. A vehicular headlamp as claimed in claim 10, wherein said light transmitting member has an accommodating portion near said optical center, operable to accommodate at least a part of said light source to be opposed to at least a part of said reflector.

12. A vehicular headlamp as claimed in claim 11, wherein said light source further includes a sealing member formed from material transmitting said light, operable to seal said semiconductor light emitting device, said accommodating portion accommodates at least a part of said sealing member, and a refractive index of said light transmitting member is approximately equal to or larger than a refractive index of said sealing member.

13. A vehicular headlamp as claimed in claim 10, wherein said reflector is formed of metal deposited on at least a part of said surface of said light transmitting member.

* * * * *